United States Patent
Pao et al.

(10) Patent No.: US 10,515,687 B2
(45) Date of Patent: Dec. 24, 2019

(54) STRAP CELL DESIGN FOR STATIC RANDOM ACCESS MEMORY (SRAM) ARRAY

(71) Applicant: Taiwan Semiconductor Manufacturing Co., Ltd., Hsinchu (TW)

(72) Inventors: Chia-Hao Pao, Kaohsiung (TW); Kian-Long Lim, Hsinchu (TW); Feng-Ming Chang, Zhubei (TW); Lien-Jung Hung, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/962,409

(22) Filed: Apr. 25, 2018

(65) Prior Publication Data

US 2019/0096474 A1 Mar. 28, 2019

Related U.S. Application Data

(60) Provisional application No. 62/564,393, filed on Sep. 28, 2017.

(51) Int. Cl.
| | |
|---|---|
| *G11C 11/412* | (2006.01) |
| *H01L 27/11* | (2006.01) |
| *H01L 27/02* | (2006.01) |
| *H01L 29/78* | (2006.01) |

(52) U.S. Cl.
CPC ........ *G11C 11/412* (2013.01); *H01L 27/0207* (2013.01); *H01L 27/1104* (2013.01); *H01L 29/785* (2013.01)

(58) Field of Classification Search
CPC .............. G11C 11/412; H01L 27/0207; H01L 27/1104; H01L 27/1116; H01L 29/785
USPC .......................................................... 365/51
See application file for complete search history.

(56) References Cited

U.S. PATENT DOCUMENTS

| | | | |
|---|---|---|---|
| 8,716,808 B2 * | 5/2014 | Deng | H01L 27/1104 257/371 |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |

(Continued)

*Primary Examiner* — Harry W Byrne
(74) *Attorney, Agent, or Firm* — McClure, Qualey & Rodack, LLP

(57) ABSTRACT

A static random access memory (SRAM) array is provided. The SRAM array includes a first bit cell array, a second bit cell array, and a strap cell. The second bit cell array is arranged along a first direction. The strap cell is arranged along a second direction and is positioned between the first bit cell array and the second bit cell array along the first direction. The strap cell includes an H-shaped NW region, an H-shaped PW region, and a deep N-type well (DNW) region. The H-shaped NW region and the H-shaped PW region each includes two strip portions extending along the first direction and a linking portion extending along the second direction. Two terminals of the linking portion are in contact with the two strip portions.

20 Claims, 10 Drawing Sheets

(56) References Cited

U.S. PATENT DOCUMENTS

| | | |
|---|---|---|
| 9,520,482 B1 | 12/2016 | Chang et al. |
| 9,576,814 B2 | 2/2017 | Wu et al. |
| 2013/0320458 A1* | 12/2013 | Deng .................. H01L 27/1104 |
| | | 257/390 |
| 2019/0096474 A1* | 3/2019 | Pao ....................... G11C 11/412 |

* cited by examiner

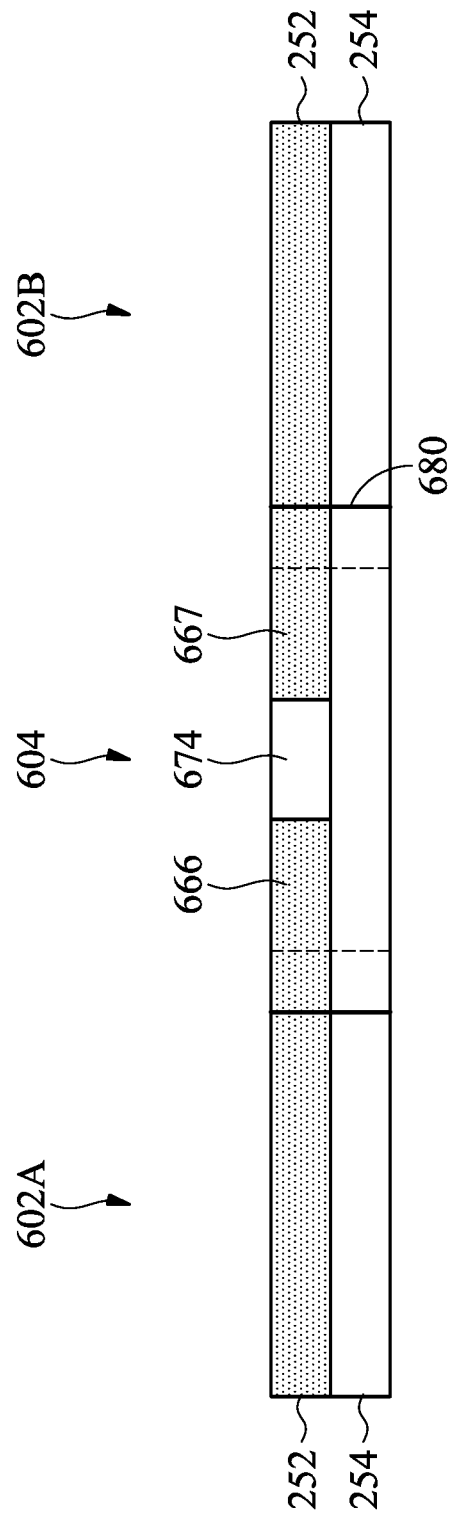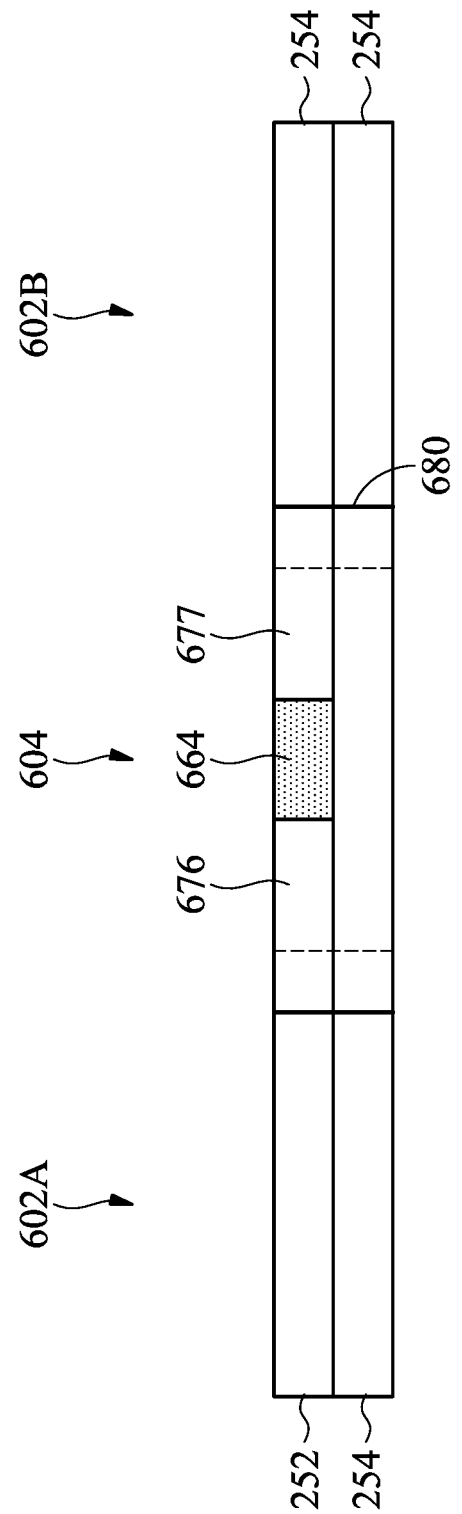

STRAP CELL DESIGN FOR STATIC RANDOM ACCESS MEMORY (SRAM) ARRAY

CROSS REFERENCE TO RELATED APPLICATIONS

This application claims the benefit of U.S. Provisional Application No. 62/564,393, filed Sep. 28, 2017, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Static Random Access Memory (SRAM) is commonly used in integrated circuits. SRAM cells have the advantageous feature of being able to hold data without the need for refreshing. With the increasingly demanding requirements on the speed of integrated circuits, the read speed and write speed of SRAM cells have also become more important. With the increasing down-scaling of the already very small SRAM cells, however, such requests are difficult to achieve. For example, the sheet resistance of metal lines, which form the word-lines and bit-lines of SRAM cells, becomes higher, and hence the RC delay of the word lines and bit-lines of SRAM cells is increased, preventing any substantial improvements in the read speed and write speed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 7A illustrates a cross-sectional views taken along line A1-A1' of FIG. 6A;

FIG. 7B illustrates a cross-sectional views taken along line A2-A2' of FIG. 6A;

DETAILED DESCRIPTION

Figure 1:
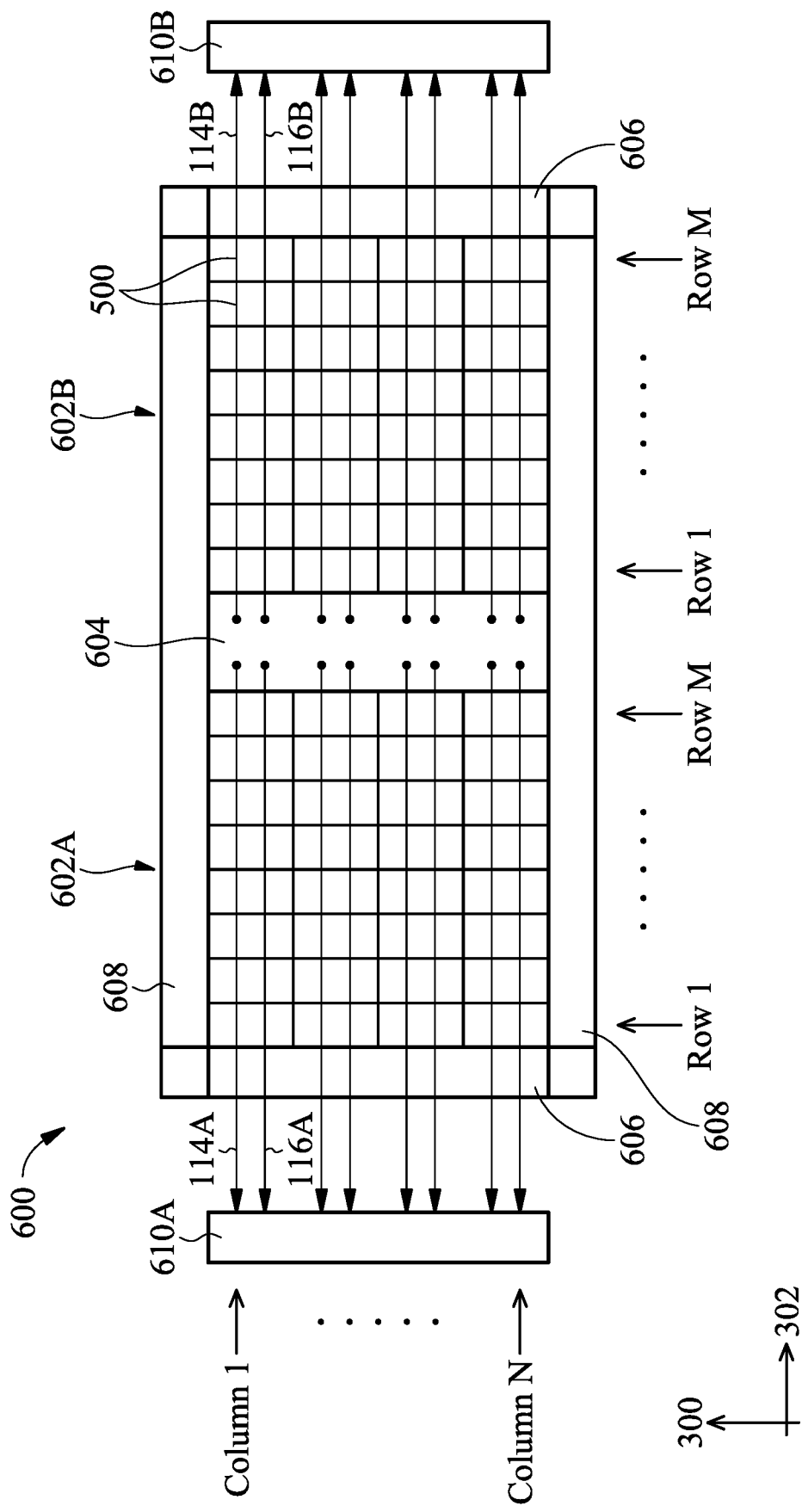
FIG. 1 illustrates a block diagram of an SRAM array in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

A static random access memory (SRAM) cell and the corresponding SRAM cell structure (e.g. a SRAM array) are provided in accordance with various exemplary embodiments. Some variations of some embodiments are discussed. Throughout the various views and illustrative embodiments, like reference numbers are used to designate like elements.

FIG. 1 illustrates a block diagram of a SRAM array 600 in accordance with some embodiments. In some embodiments, the SRAM array 600 includes a bit cell array 602A, a bit cell array 602B, a strap cell 604 and edge SRAM cells 606 and 608.

In some embodiments, the SRAM bit cell arrays 602A and 602B are arranged along a column direction (i.e. a direction 302). In some embodiments, each of the bit cell arrays 602A and 602B includes a plurality of SRAM cells 500, for example, functional SRAM cells. The SRAM cells 500 of the bit cell arrays 602A and 602B may be configured to be electrically connected to control circuits 610A and 610B. In some embodiments, the SRAM array 600 includes the SRAM cells 500 having a six port SRAM circuit layout with six transistors. In some other embodiments, the SRAM array 600 includes the SRAM cells 500 having a different number of ports, such as an eight port SRAM circuit layout, and various embodiments are not limited to a particular memory cell circuit.

In some embodiments, each of the SRAM cells 500 in each of the bit cell arrays 602A and 602B are arranged in rows (along a direction 300) and columns (along the direction 302). For example, the columns of the SRAM cells 500 in each of the bit cell arrays 602A and 602B may be arranged in the direction 302. As shown in FIG. 1, each of the bit cell arrays 602A and 602B may include N columns, where N is a positive integer, in accordance with some embodiments. For example, the rows of the SRAM cells 500 in each of the bit cell arrays 602A and 602B may be arranged in the direction 300 that is different than the direction 302. As shown in FIG. 1, each of the bit cell arrays 602A and 602B may include M rows, where M is a positive integer, in accordance with some embodiments. For example, each of the bit cell arrays 602A and 602B may include four columns and eight rows (denoted as "4×8" SRAM cells) as shown in FIG. 1. Therefore, each of the bit cell arrays 602A and 602B may include, for example, 64×64 SRAM cells, 128×128 SRAM cells, 256×256 SRAM cells, or the like. The number of SRAM cells in the bit cell array 602A may be the same or different than the number of SRAM cells in the bit cell array 602B.

Each of the SRAM cells 500 in the SRAM array 600 includes a bit line portion BL extending in the direction 302, a complementary bit line portion BLB extending in the direction 302, a word line portion word line (WL) (e.g. a WL 122 shown in FIGS. 2 and 3) extending in the direction 300, a connection to a first voltage line Vss (not shown), and a connection to second voltage line Vdd (not shown). In some embodiments, the SRAM cells 500 arranged in the same column along the direction 302 (i.e. the column direction) share a common bit line (BL) (e.g. a BL 114A and a BL 114B) and a common bit line bar (BLB) (e.g. a BLB 116A and a BLB 116B). For example, each of the SRAM cells 500 in the same column in the bit cell array 602A (or the bit cell array 602B) includes a portion of a BL and a BLB, which when combined with other SRAM cells 500 in the column in the bit cell array 602A (or the bit cell array 602B) forms continuous conductive lines (the BL and the BLB). In addition, the SRAM cells 500 arranged in the same row along the direction 300 may share a common word line (WL). The BLs 114A (or 114B) and the BLBs 116A (or 116B) may be electrically connected to the control circuits 610A (or 610B), which may activate certain the BLs 114A (or 114B) and/or the BLBs 116A (or 116B) to select a particular column in the SRAM array 600 for read and/or write operations. In some embodiments, the control circuits 610A and 610B further include amplifiers to enhance a read and/or write signal. For example, the control circuits 610A and 610B may include selector circuitry, driver circuitry, sense amplifier (SA) circuitry, combinations thereof, and the like.

In some embodiments, the strap cell 604 arranged along the direction 300 (i.e. the row direction) and positioned between the bit cell arrays 602A and 602B along the direction 302 (i.e. the column direction). The strap cell 604 may help to make the performance of the SRAM array 600 more uniform among the inner cells and the edge cells of the SRAM array. For example, the strap cell 604 of the SRAM array 600 may include both N-type well (NW) regions that make an electrical connection between a voltage line and an NW region in a substrate, and P-type well (PW) regions that make an electrical connection between a voltage line and a PW region in a substrate. These connections are used to help with uniform charge distribution throughout the SRAM array. The layout of the strap cell 604 may be described in greater detail below using the following figures (e.g. FIG. 6A, FIG. 6B, FIG. 7A, FIG. 7B, FIG. 8A, FIG. 8B and FIG. 9).

In some embodiments, the edge (dummy) cells 606 and 608 are arranged around a periphery of the bit cell arrays 602A and 602B and the strap cell 604. Each of the edge (dummy) cells 606 and 608 may include a dummy SRAM cell. The arrangement of the dummy SRAM cell may be the same or similar to the SRAM cell 500. In addition, the dummy SRAM cell may not perform any circuit function. The edge cells 606 and 608 may have any suitable configuration and may be included for improved uniformity of fins and/or metal features. For example, each column of the bit cell arrays 602A and 602B and the strap cell 604 may begin and end with the edge cell 606. For example, each row of the bit cell arrays 602A and 602B and the strap cell 604 may begin and end with the edge cell 608. For example, the edge cells 606 may be equal in quantity to a quantity of columns of the bit cell arrays 602A (or 602B) in the SRAM array 600. In addition, the edge cells 608 may be equal in quantity to a quantity of rows of the bit cell arrays 602A and 602B in the SRAM array 600.

Figure 2:
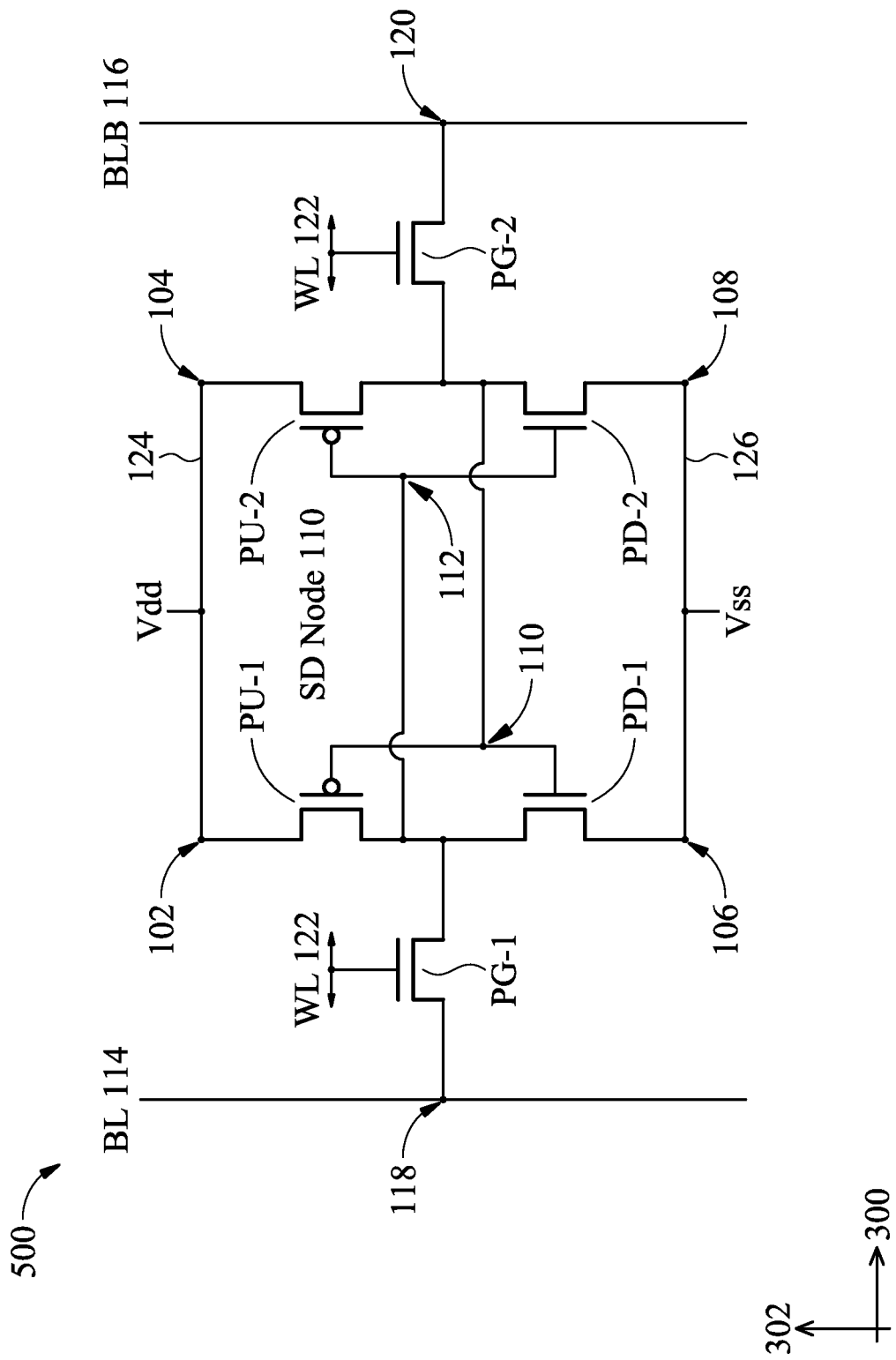
FIG. 2 illustrates circuit diagrams of a static random access memory (SRAM) cell in accordance with some embodiments.
Figure 3:
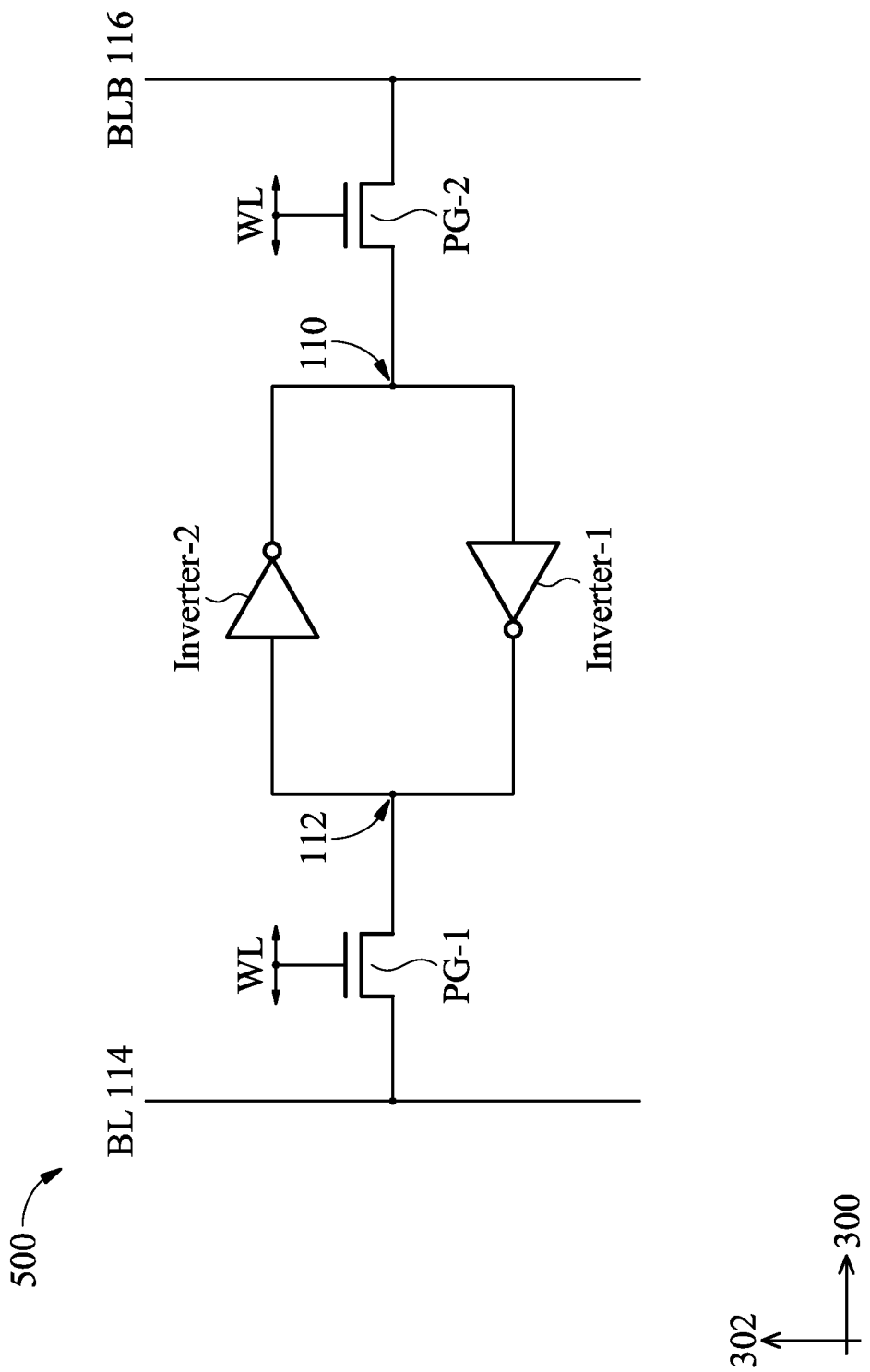
FIG. 3 illustrates circuit diagrams of a static random access memory (SRAM) cell in accordance with some embodiments.

FIG. 2 illustrates a circuit diagram of SRAM cell 500 in accordance with some embodiments. FIG. 3 illustrates an alternative circuit diagram of the SRAM cell 500 in accordance with some embodiments. Each of the SRAM cells 500 in the SRAM array 600 shown in FIG. 1 may have a circuit layout shown in FIG. 2 and FIG. 3. For example, FIG. 2 and FIG. 3 may illustrate a six port SRAM circuit layout with six transistors. Other SRAM circuit layouts may be used in some other embodiments.

In some embodiments, the SRAM cell 500 includes pass-gate transistors PG-1 and PG-2, pull-up transistors PU-1 and PU-2 and pull-down transistors PD-1 and PD-2, as shown in FIG. 2. The pass-gate transistors PG-1 and PG-2 and pull-up transistors PU-1 and PU-2 are p-type metal-oxide-semiconductor (PMOS) transistors. The pull-down transistors PD-1 and PD-2 are n-type metal-oxide-semiconductor (NMOS) transistors. The gates of the pass-gate transistors PG-1 and PG-2 are connected to, and controlled by, a word-line (WL) 122 that determines whether SRAM cell 500 is selected or not. A latch formed of the pull-up transistors PU-1 and PU-2 and the pull-down transistors PD-1 and PD-2 stores a bit, and the complementary values of the bit are stored in storage node 110 and storage node 112. The stored bit can be written into, or read from, the SRAM cell 500 through a bit-line (BL) 114 and a bit-line Bar (BLB) 116. In addition, the BL 114 and the BLB 116 may carry complementary bit-line signals. In some embodiments, the SRAM cell 500 is powered through a positive power supply node Vdd that has a positive power supply voltage (also denoted as Vdd). The SRAM cell 500 is also connected to power supply voltage Vss (also denoted as Vss), which may be an electrical ground. In some embodiments, the pull-up transistor PU-1 and the pull-down transistor PD-1 collectively form a first inverter. The pull-up transistor PU-2 and the pull-down transistor PD-2 may collectively form a second inverter. The input of the first inverter is connected to the pass-gate transistor PG-1 and the output of the second inverter. In addition, the output of the first inverter is connected to pass-gate transistor PG-2 and the input of the second inverter.

The sources of the pull-up transistors PU-1 and PU-2 are connected to a power supply voltage-node (CVdd-node) 102 and a CVdd-node 104, respectively, which are further connected to power supply voltage Vdd through a power supply voltage (CVdd) line 124. The power supply voltage Vdd may be carried by a metal line. The sources of the pull-down transistors PD-1 and PD-2 are connected to a power supply voltage-node (CVss-node) 106 and a CVss-node 108, respectively, which are further connected to power supply voltage Vss through a power supply voltage (CVss) line 126. The power supply voltage Vss may be carried by a metal line. The gates of the pull-up transistor PU-1 and the pull-down transistor PD-1 are connected to the drains of the pull-up transistor PU-2 and the pull-down transistor PD-2, in which the connection node is the storage node 110. The gates of the pull-up transistor PU-2 and the pull-down transistor PD-2 are connected to the drains of the pull-up transistor PU-1 and the pull-down transistor PD-1, in which the connection node is the storage node 112. A source/drain region of the pass-gate transistor PG-1 is connected to the bit-line (BL) 114 at a bit-line node 118. A source/drain region of the pass-gate transistor PG-2 is connected to the bit-line bar (BLB) 116 at a bit-line bar node 120.

FIG. 3 illustrates an alternative circuit diagram of the SRAM cell 500 in accordance with some embodiments. In some embodiments, the pull-up transistor PU-1 and the pull-down transistor PD-1 shown in FIG. 2 are represented as a first inverter Inverter-1. In addition, the pull-up transistor PU-2 and the pull-down transistor PD-2 are represented as a second inverter Inverter-2. In some embodiments, the second inverter Inverter-2 is cross-latched with the first inverter Inverter-1. More specifically, the output of the first inverter Inverter-1 is connected to the pass-gate transistor PG-1 and the input of the second inverter Inverter-2. The output of the second inverter Inverter-2 is connected to the pass-gate transistor PG-2 and the input of the first inverter Inverter-1.

Figure 4:
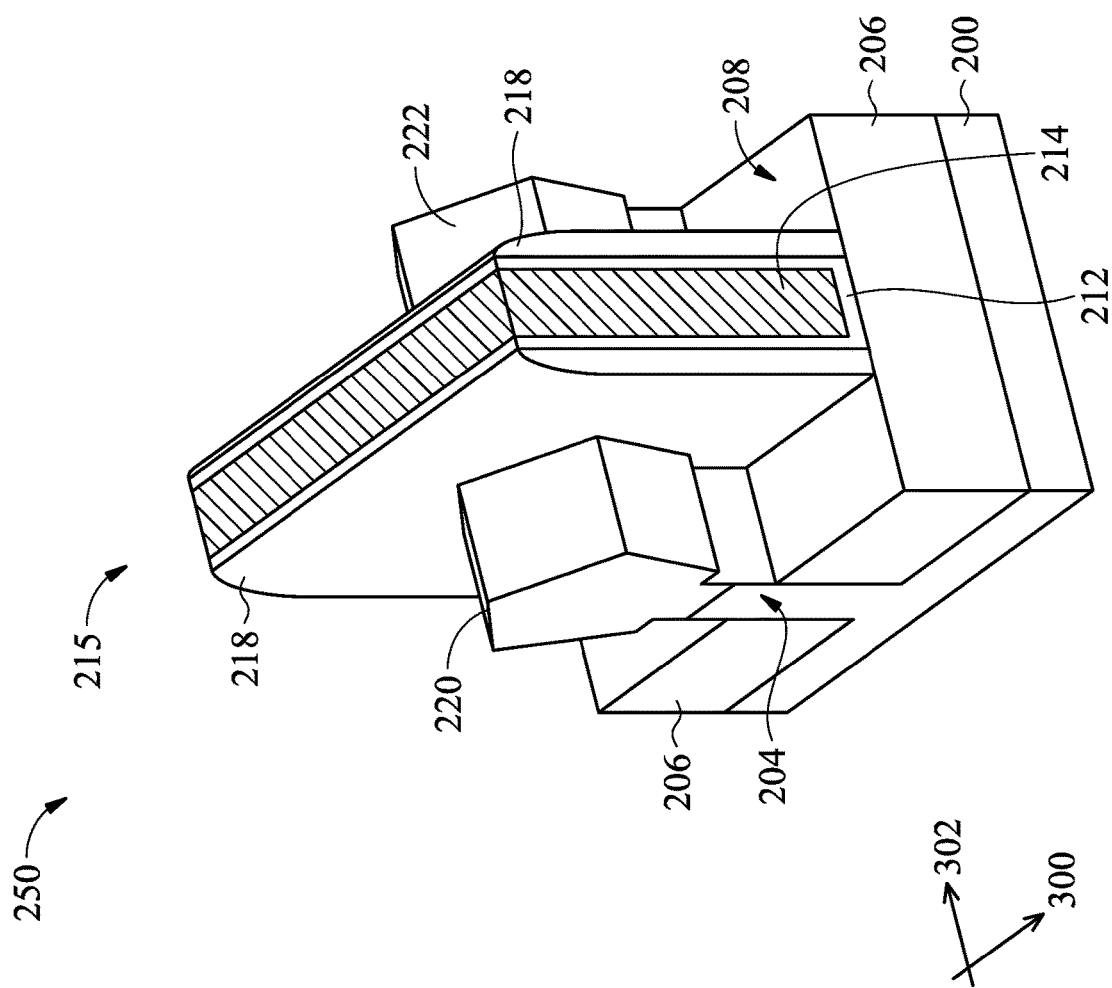
FIG. 4 is a perspective view of a fin field-effect transistor (FinFET) in accordance with some embodiments.

FIG. 4 illustrates a perspective view of a fin field effect transistor (FinFET) 250, which may serve as any of the transistors in the SRAM cell 500, including the pull-up transistor PU-1, the pull-up transistor PU-2, the pull-down transistor PD-1, the pull-down transistor PD-2, the pass-gate transistor PG-1, and the pass-gate transistor PG-2. In some embodiments, the FinFET 250 includes a semiconductor fin 204, a gate structure 215, spacers 218, a drain region 220 and a source region 222. The semiconductor fin 204 extends above a semiconductor substrate 200. In some embodiments, the semiconductor substrate 200 and the semiconductor fin 204 are made of the same material. For example, the substrate 200 is a silicon substrate. In some instances, the substrate 200 includes a suitable elemental semiconductor, such as germanium or diamond; a suitable compound semiconductor, such as silicon carbide, gallium nitride, gallium arsenide, or indium phosphide; or a suitable alloy semiconductor, such as silicon germanium, silicon tin, aluminum gallium arsenide, or gallium arsenide phosphide. In some embodiments, the substrate 200 is a silicon on insulator (SOI) layer substrate or a silicon on sapphire (SOS) substrate. In some embodiments, the semiconductor substrate 200 and the semiconductor fin 204 are made of different materials.

In some embodiments, the semiconductor fin 204 of the FinFET 250 may be surrounded by isolating features 206 formed on opposite sides of the semiconductor fin 204. The isolating features 206 may electrically isolate an active region (not shown) of the FinFET 250 from other active regions. In some embodiments, the isolating features 206 are shallow trench isolation (STI), field oxide (FOX), or another suitable electrically insulating structure. For example, the semiconductor fin 204 represents semiconductor fins 204-1, 204-2, 204-3 and 204-4 in a layout of the SRAM cell 500 shown in FIG. 5.

In some embodiments, the gate structure 215, which includes a gate dielectric 212 and a gate electrode 214 formed over the gate dielectric 212, is positioned over sidewalls and a top surface of the semiconductor fin 204. Therefore, a portion of the semiconductor fin 204 overlaps the gate structure 215 may serve as a channel region of the FinFET 250. In some embodiments, the channel region of p-type FinFETs, for example, the pull-up transistor PU-1 and the pull-up transistor PU-2, the channel region include a SiGe channel region. In addition, the Ge concentration in the SiGe channel region is in a range from about 10 at % to about 40 at %. In some embodiments, the gate dielectric 212 is a high dielectric constant (high-k) dielectric material. A high-k dielectric material has a dielectric constant (k) higher than that of silicon dioxide. Examples of high-k dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof. In some embodiments, the gate electrode 214 is made of a conductive material, such as aluminum (Al), copper (Cu), tungsten (W), titanium (Ti), tantalum (Ta), or another applicable material.

In some embodiments, the spacers 218 of the FinFET 250 are positioned over sidewalls and a top surface of the semiconductor fin 204. In addition, the spacers 218 may be formed on opposite sides of the gate structure 215. In some embodiments, the spacers 218 are made of silicon nitride, silicon oxynitride, silicon carbide, another suitable material, or a combination thereof.

In some embodiments, portions of the semiconductor fin 204 that are not covered by the gate structure 215 and the spacers 218 serve as a drain region 220 and a source region 222. In some embodiments, the drain region 220 and the source region 222 of p-type FinFETs, for example, the pass-gate transistor PG-1, the pass-gate transistor PG-2, the pull-up transistor PU-1 and the pull-up transistor PU-2 are formed by implanting the portions of the semiconductor fin 204 that are not covered by the gate structure 215 and the spacers 218 with a p-type impurity such as boron, indium, or the like. In some embodiments, the drain region 220 and the source region 222 of n-type FinFETs, for example, the pull-down transistor PD-1 and the pull-down transistor PD-2 are formed by implanting the portions of the semiconductor fin 204 that are not covered by the gate structure 215 and the spacers 218 with an n-type impurity such as phosphorous, arsenic, antimony, or the like.

In some embodiments, the drain region 220 and the source region 222 are formed by etching portions of the semiconductor fin 204 that are not covered by the gate structure 215 and the spacers 218 to form recesses, and growing epitaxial regions in the recesses. The epitaxial regions may be formed of Si, Ge, SiP, SiC, SiPC, SiGe, SiAs, InAs, InGaAs, InSb, GaAs, GaSb, InAlP, InP, C, or a combination thereof. Accordingly, in FIG. 4, the drain region 220 and the source region 222 may be formed of silicon germanium (SiGe) in some exemplary embodiments, while the remaining semiconductor fin 204 may be formed of silicon. In some embodiments, p-type impurities are in-situ doped in the drain region 220 and the source region 222 during the epitaxial growth of the drain region 220 and the source region 222 of the p-type FinFET 250, for example, the pass-gate transistor PG-1, the pass-gat transistor PG-2, the pull-up transistor PU-1 and the pull-up transistor PU-2. In addition, n-type impurities are in-situ doped in the drain region 220 and the source region 222 during the epitaxial growth of the drain region 220 and the source region 222 of the n-type FinFET 250, for example, the pull-down transistor PD-1 and the pull-down transistor PD-2.

In some other embodiments, the pass-gate transistors PG-1 and PG-2, pull-up transistors PU-1 and PU-2, and pull-down transistors PD-1 and PD-2 of the SRAM cell 500 are planar MOS devices.

Figure 5:
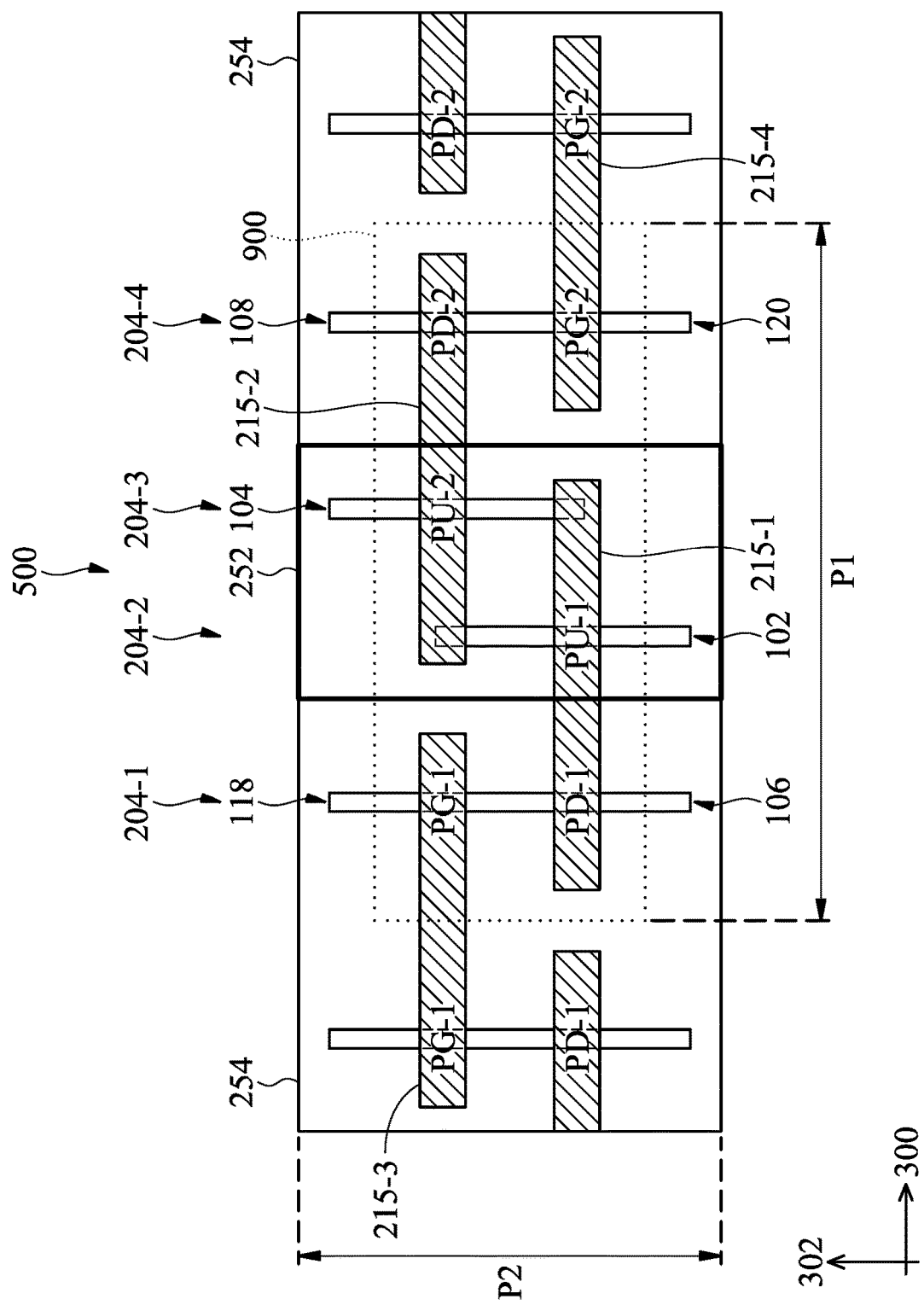
FIG. 5 illustrates a layout of a SRAM unit cell in an SRAM array in accordance with embodiments.

FIG. 5 illustrates the layout of the SRAM cell 500 in each of the bit cell arrays 602A and 602B in the SRAM array 600 (FIG. 1) in accordance with embodiments. The SRAM cell 500 may serve as a SRAM unit cell.

In some embodiments, the SRAM cell 500 is arranged in an array in each of the bit cell arrays 602A and 602B (FIG. 1) including a plurality of rows and a plurality of columns. In addition, the SRAM cells 500 may be arranged in the same row with a pitch P1 in the direction 300 (the row direction). Furthermore, the SRAM cells 500 may be arranged in the same column as a pitch P2 in the direction 302 (the column direction). The adjacent two SRAM cells 500 are arranged in mirror symmetry. An outer boundary 900 of each of the SRAM cells 500 is illustrated using dashed lines, which mark a rectangular region. An NW region 252 may be arranged at the middle of the SRAM cell 500. In addition, two PW regions 254 may be arranged on opposite sides of the NW region 252 along the direction 300. Furthermore, the CVdd-node 102, the CVdd-node 104, the CVss-node 106, the CVss-node 108, the BL node 118 and the BLB node 120, which are shown in FIG. 2, are also illustrated in FIG. 5.

In some embodiments, as shown in FIG. 5, the SRAM cell 500 includes the pass-gate fin field-effect transistors (FinFETs) PG-1 and PG-2, the pull-up FinFETs PU-1 and PU-2, and the pull-down FinFETs PD-1 and PD-2 formed by arranging four separate gate electrode patterns 215-1, 215-2, 215-3 and 215-4 on the four semiconductor fins 204-1, 204-2, 204-3 and 204-4.

In some embodiments, as shown in FIG. 5, the semiconductor fins 204-1, 204-2, 204-3 and 204-4 are arranged along the direction 300 (e.g. the row direction shown in FIG. 1) and extend along the direction 302 (e.g. the column direction shown in FIG. 1) that is different from direction 300. For example, direction 302 is substantially perpendicular to direction 300. In some embodiments, direction 302 serves as the longitudinal direction of semiconductor fins 204-1, 204-2, 204-3 and 204-4.

In some embodiments, as shown in FIG. 5, the gate electrode patterns 215-1, 215-2, 215-3 and 215-4 are strip (line) shapes extending substantially along the direction 300.

For example, the gate electrode pattern 215-1 may be positioned overlying the semiconductor fin 204-1, the semiconductor fin 204-2 and extends to cover an end portion of the semiconductor fin 204-3. The gate electrode pattern 215-2 may be positioned overlying the semiconductor fin 204-3 and the semiconductor fin 204-4 and may extend to cover an end portion of the semiconductor fin 204-2. The gate electrode pattern 215-3 may be positioned overlying the semiconductor fin 204-1. In addition, the gate electrode pattern 215-4 may be positioned overlying the semiconductor fin 204-4.

In some embodiments, as shown in FIG. 5, the gate electrode pattern 215-1 forms the pull-down FinFET PD-1 with the underlying semiconductor fin 204-1 (in the PW region 254 on the left side of the NW region 252). In addition, the gate electrode pattern 215-1 may form the pull-up FinFET PU-1 with the underlying semiconductor fin 204-2 (in the NW region 252). The gate electrode pattern 215-2 forms the pull-down FinFET PD-2 with the underlying semiconductor fin 204-4 (in the PW region 254 on the right side of the NW region 252). In addition, the gate electrode pattern 215-2 forms the pull-up FinFET PU-2 with the underlying semiconductor fin 204-3 (in the NW region 252). The gate electrode pattern 215-3 forms the pass-gate FinFET PG-1 with the underlying semiconductor fin 204-1, which is the same semiconductor fin that also forms the pull-down FinFET PD-1. The gate electrode pattern 215-4 forms the pass-gate FinFET PG-2 with the underlying semiconductor fin 204-4, which is the same semiconductor fin that also forms the pull-down FinFET PD-2.

In some embodiments, the gate electrode pattern 215-1 of the pull-up FinFET PU-1 and the pull-down FinFET PD-1 is aligned to the gate electrode pattern 215-4 of the pass-gate FinFET PG-2 substantially along the direction 300. In addition, the gate electrode pattern 215-2 of the pull-up FinFET PU-2 and the pull-down FinFET PD-2 may be aligned to the gate electrode pattern 215-3 of the pass-gate FinFET PG-1 substantially along the direction 300.

In some embodiments, the gate electrode pattern 215-1 of the pull-down FinFET PD-1 and the pull-up FinFET PU-1, the gate electrode pattern 215-2 of the pull-down FinFET PD-2 and the pull-up FinFET PU-2 are positioned within a boundary 900 of the SRAM cell 500. In addition, the gate electrode patterns 215-3 of the pass-gate FinFETs PG-1 of the two adjacent SRAM cells may be in contact with each other. Similarly, the gate electrode patterns 215-4 of the pass-gate FinFETs PG-2 of the two adjacent SRAM cells may be in contact with each other.

Figure 6A:
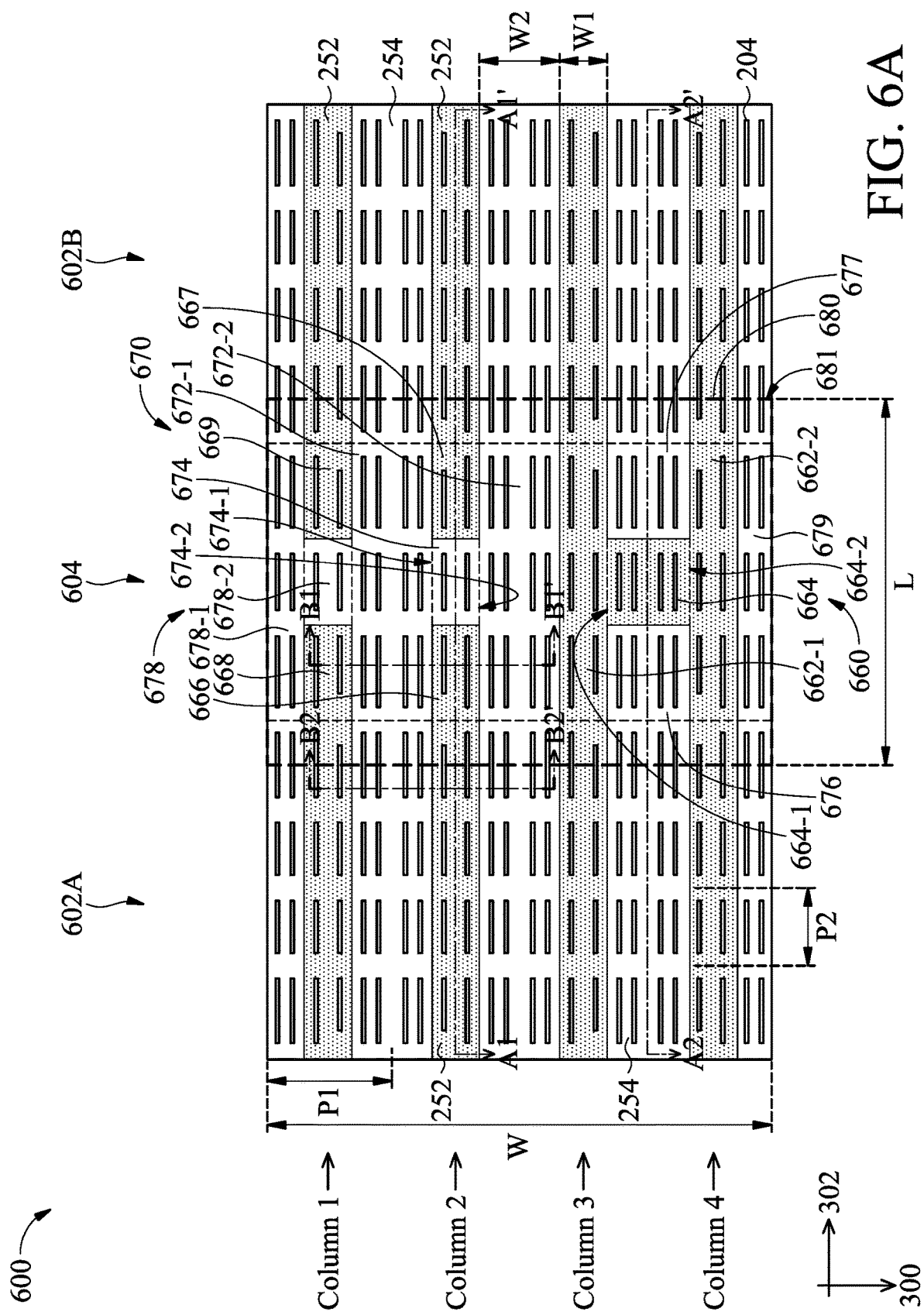
FIGS. 6A and 6B illustrate layouts of an SRAM array in accordance with some embodiments.
Figure 6B:
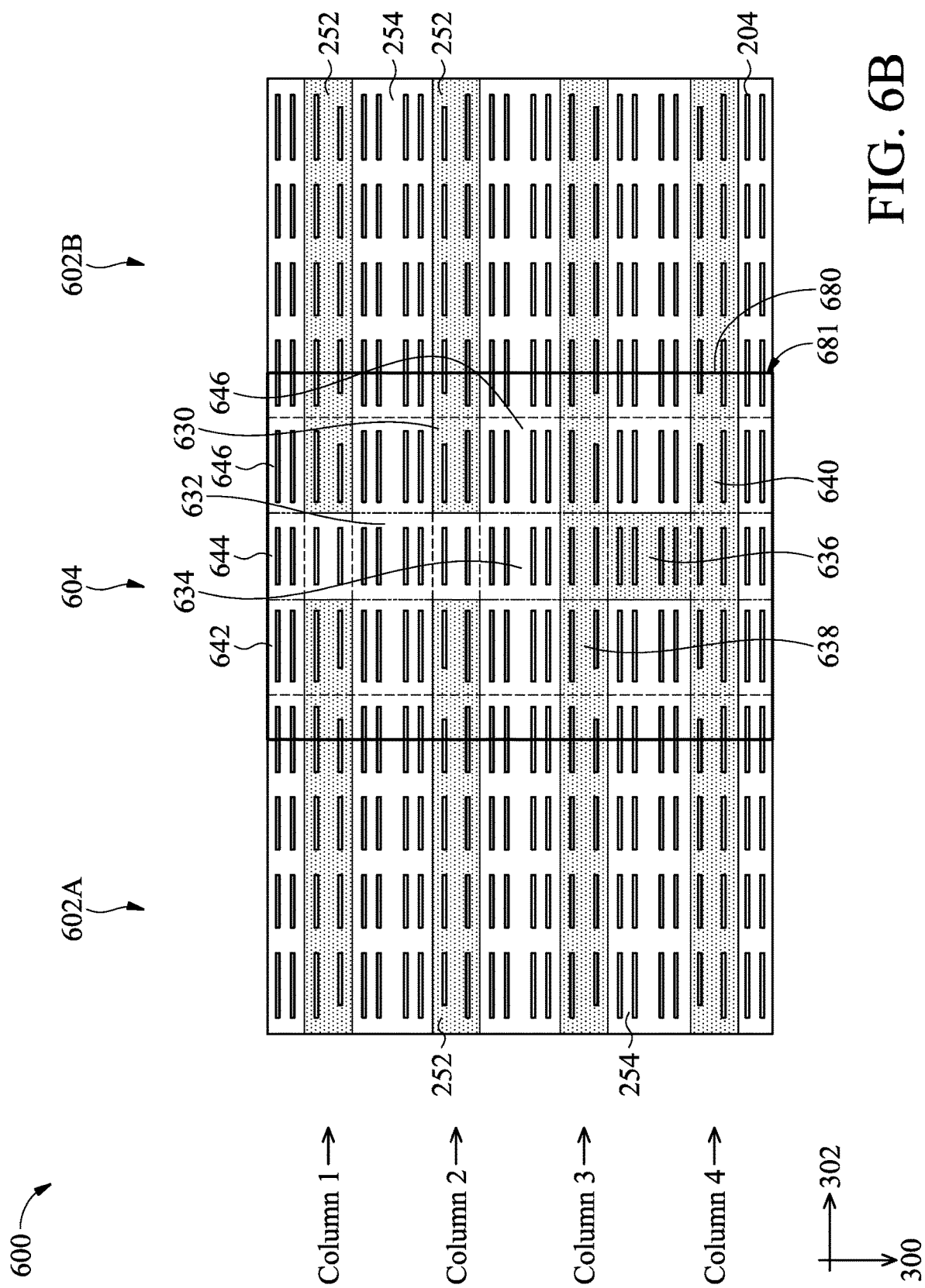

FIGS. 6A and 6B illustrate layouts each including an N-type well (NW) region 252, a P-type well (PW) region 254 and a deep N-type well (DNW) region 680 in a portion of the SRAM array 600 in accordance with some embodiments. FIGS. 6A and 6B illustrate the arrangement of the semiconductor fins 204. In addition, the arrangements of the NW regions and the PW regions in the strap cell 604 illustrated in FIGS. 6A and 6B may be the same but labeled in different reference signs for the following detailed description. For example, the strap cell 604 shown in FIGS. 6A and 6B may serve as a strap unit cell. The width of the strap cell 604 along the direction 300 may be the same to four times of the pitch P1 of the SRAM cells 500 (i.e. W=4P1). The length L of the strap cell 604 along the direction 302 may be the same to three times of the pitch P2 of the SRAM cells 500 (i.e. L=3P2). Furthermore, FIGS. 6A and 6B merely illustrate a portion of the bit cell array 602A and a portion of the bit cell array 602B (e.g., four columns and four rows) for the sake of the convenience. Moreover, the edge SRAM cells 606 and 608 (FIG. 1) of the SRAM array 600 are not shown in FIGS. 6A and 6B.

In some embodiments, the strap cell 604 includes an H-shaped NW region 660 and an H-shaped PW region 670 in a view along the direction 300 of a plan view as shown in FIG. 6A. The H-shaped PW region 670 may be positioned adjacent to (next to) the H-shaped NW 660 region along the direction 300 (e.g. the row direction). In some embodiments, the H-shaped NW region 660 includes two strip portions 662-1 and 662-2 and a linking portion 664. The strip portions 662-1 and 662-2 may be positioned extending along the direction 302 (e.g. the column direction). In addition, the linking portion 664 may be positioned extending along the direction 300 (e.g. the row direction). Furthermore, two terminals 664-1 and 664-2 of the linking portion 664 may be in contact with the two strip portions 662-1 and 662-2. Similarly, the H-shaped PW region 670 may include two strip portions 672-1 and 672-2 and a linking portion 674. The strip portions 672-1 and 672-2 may be positioned extending along the direction 302 (e.g. the column direction). In addition, the linking portion 674 may be positioned extending along the direction 300 (e.g. the row direction). Furthermore, two terminals 674-1 and 674-2 of the linking portion 674 may be in contact with the two strip portions 672-1 and 672-2. In some embodiments, the strip portion 662-1 of the H-shaped NW region 660 is in contact with the strip portion 672-2 of the H-shaped PW region 670.

In some embodiments, the strap cell 604 further includes a PW region 676 and a PW region 677 adjacent to opposite sides of the linking portion 664 of the H-shaped NW region 660 along the direction 302 (e.g. the column direction) in the plan view as shown in FIG. 6A. In addition, the strap cell 604 may include an NW region 666 and an NW region 667 adjacent to opposite sides of the linking portion 674 of the H-shaped PW region 670 along the direction 302 (e.g. the column direction).

The strip portions 662-1 and 662-2 of the H-shaped NW region 660 may have the same width W1 along the direction 300. The strip portions 672-1 and 672-2 of the H-shaped PW region 670 may have the same width W2 along the direction 300. In addition, the width W1 of the strip portion 662-1 (or 662-2) of the H-shaped NW region 660 may be less than the width W2 of the strip portion 672-1 (or 672-2) of the H-shaped PW region 670. For example, the width W2 may be two times as large as the width W1 (because the PW regions of the adjacent SRAM cells in the direction 300 may be merged together and have a width W2, the width of the merged PW region of the adjacent SRAM cells may be two times as large as the width of the NW region of each of the adjacent SRAM cells).

The strap cell 604 may include a T-shaped PW region 678 arranged adjacent to the strip portion 672-1 of the H-shaped PW region 670, as shown in FIG. 6A in accordance with some embodiments. The T-shaped PW region 678 and the linking portion 674 of the H-shaped PW region 670 may be positioned on opposite sides of the strip portion 672-1 of the H-shaped PW region 670, along the direction 300. For example, the T-shaped PW region 678 may include a horizontal portion 678-1 along the direction 302 and a vertical portion 678-2 along the direction 300. The vertical portion 678-2 may be positioned between the horizontal portion 678-1 and the strip portion 672-1. In addition, NW regions 668 and 669 may be positioned on opposite sides of the vertical portion 678-2 along the direction 302. Furthermore, the horizontal portion 678-1 and the vertical portion 678-2 may have the same widths W1 along the direction 300.

The strap cell 604 may include a strip-shaped PW region 679 adjacent to the strip portion 662-1 of the H-shaped NW region 660, as shown in FIG. 6A in accordance with some embodiments. The strip-shaped PW region 679 may extend along the direction 302. In addition, the strip-shaped PW region 679 and the linking portion 664 of the H-shaped NW region 660 may be positioned on opposite sides of the strip portion 662-2 of the H-shaped NW region 660, along the direction 300. The strip-shaped PW region 679 may have a width W1 along the direction 300.

In some embodiments, the strap cell 604 further includes a deep N-type well (DNW) region 680 underlying the H-shaped NW region 660, the NW region 666, 667, 668 and 669, the H-shaped PW region 670, the PW regions 676 and 677, the T-shaped PW region 678 and the strip-shaped PW region 679. In addition, a boundary 681 of the DNW region 680 may surround a boundary of the strap cell 604. Portions of the boundary 681 of the DNW region 680 along the direction 300 may be positioned in the within the bit cell array 602A and the bit cell array 602B.

In some embodiments, the bit cell array 602A and the bit cell array 602B each includes NW regions 252 and PW regions 254 extending along the direction 302 (e.g. the column direction). In addition, the NW regions 252 and the PW regions 254 may be arranged alternately along the direction 300 (e.g. the row direction). For example, the bit cell array 602A and the bit cell array 602B may each include four columns (e.g., Column 1, Column 2, Column 3 and Column 4), which allows four SRAM cells 500 (FIG. 5) to be arranged in the same row along the direction 300. Therefore, the PW regions of the adjacent SRAM cells in the direction 300 may be merged together to form the PW region 254 having the width W2. The width W2 of the PW region 254 may be two times larger than the width W1 of the NW region 252. In addition, the pitch P1 of the SRAM cells 500 (FIG. 5) may be equal to the total width of the PW region 254 (W2) and the NW region 252 (W1) along the direction 300. Furthermore, the total width of the H-shaped NW region 660 and the H-shaped PW region 670 along the row direction may be three times as long as the pitch P1 of the SRAM cells 500 (FIG. 5).

In some embodiments, the strip portions 662-1 and 662-2 of the H-shaped NW region 660 of the strap cell 604 are respectively in direct contact with the corresponding NW regions 252 in the bit cell array 602A and the bit cell array 602B. In addition, the NW regions 666, 667, 668 and 669 of the strap cell 604 may be respectively in direct contact with the NW regions 252 in the bit cell array 602A and the bit cell array 602B. The strip portions 672-1 and 672-2 of the H-shaped PW region 670, the horizontal portion 678-1 of the T-shaped PW region 678 and the strip-shaped PW region 679 of the strap cell 604 may be respectively in direct contact with the corresponding PW regions 254 in the bit cell array 602A and the bit cell array 602B. Furthermore, the PW regions 676 and 677 of the strap cell 604 may be respectively in direct contact with the corresponding PW regions 254 in the bit cell array 602A and the bit cell array 602B.

The layout of the PW regions and the NW regions in the strap cell 604 may be represented in other ways shown in FIG. 6B, in accordance with some embodiments. In some embodiments, the strap cell 604 includes a first strap column 630, a second strap column 632, a third strap column 634, a fourth strap column 636, a fifth strap column 638 and a sixth strap column 640 arranged along the direction 300 and extending along the direction 302 in the plan view shown in FIG. 6B. The first strap column 630, the second strap column 632, the third strap column 634, the fourth strap column 636, the fifth strap column 638 and the sixth strap column 640 may each have a length L along the direction 302. In addition, the strap cell 604 may include a first strap row 642, a second strap row 644 and a third strap row 646 arranged along the direction 302 and extending along the direction 300. The length of the first strap row 642, the second strap row 644 and the third strap row 646 may each be three time less than the length L of each of the strap columns (630, 632, 634, 636, 638 and 640) of the strap cell 604.

Please refer to FIGS. 6A and 6B, the first strap column 630 (FIG. 6B) includes the linking portion 674 of the H-shaped PW region 670 (i.e. the PW region) and the NW regions 666 and 667 (FIG. 6A). The linking portion 674 of the H-shaped PW region 670 may serve as a PW region 674 of the first strap column 630, in accordance with some embodiments. The NW regions 666 and 667 may be positioned on opposite sides of the PW region 674 along the direction 302 (e.g. the column direction). The second strap column 632 (FIG. 6B) may include the strip portion 672-1 of the H-shaped PW region 670 (FIG. 6A). The strip portion 672-1 of the H-shaped PW region 670 may serve as a PW region 672-1 of the second strap column 632. In addition, the length of the PW region 672-1 is equal to the length L of the second strap column 632 along the direction 302. The third strap column 634 (FIG. 6B) may include the strip portion 672-2 of the H-shaped PW region 670 (FIG. 6A). The strip portion 672-2 of the H-shaped PW region 670 may serve as a PW region 672-2 of the third strap column 634. In addition, the length of the PW region 672-2 is equal to the length L of the third strap column 634 along the direction 302. Therefore, the PW region 674 of the first strap column 630 may directly connect to the PW region 672-1 of the second strap column 632 and the PW region 672-2 of the third strap column 634 to form the H-shaped PW region 670 in the plan view shown in FIGS. 6A and 6B, in accordance with some embodiments. The second strap column 632 and the third strap column 634 may have the same width W2 that is greater than the width W1 of the first strap column 630 along the direction 300.

Please refer to FIGS. 6A and 6B, the fourth strap column 636 (FIG. 6B) includes the linking portion 664 of the H-shaped NW region 660 and the PW regions 676 and 677 (FIG. 6A). The linking portion 664 of the H-shaped NW region 660 may serve as an NW region 664 of the fourth strap column 636, in accordance with some embodiments. The PW regions 676 and 677 may be positioned on opposite sides of the NW region 664 along the direction 302 (e.g. the column direction). The fifth strap column 638 (FIG. 6B) may include the strip portion 662-1 of the H-shaped NW region 660 (FIG. 6A). The strip portion 662-1 of the H-shaped NW region 660 may serve as an NW region 662-1 of the fifth strap column 638. In addition, the length of NW region 662-1 is equal to the length L of the fifth strap column 638. The sixth strap column 640 (FIG. 6B) may include the strip portion 662-2 of the H-shaped NW region 660 (FIG. 6A). The strip portion 662-2 of the H-shaped NW region 660 may serve as the NW region 662-2 of the sixth strap column 640. In addition, the length of NW region 662-2 is equal to the length L of the sixth strap column 640. Therefore, the NW region 664 of the fourth strap column 636 may directly connect to the NW region 662-1 of the fifth strap column 638 and the NW region 662-2 of the sixth strap column 640 to form the H-shaped NW region 660 in the plan view shown in FIGS. 6A and 6B, in accordance with some embodiments.

The width W2 of the fourth strap column 636 may be greater than the width W1 of the fifth strap column 638 and of the sixth strap column 640.

The strap cell 604 may further include a seventh strap column formed of the horizontal portion 678-1 of the T-shaped PW region 678 (FIG. 6A). The strap cell 604 may further include an eighth strap column formed of the vertical portion 678-2 of the T-shaped PW region 678, the NW regions 668 and 669 (FIG. 6A). In addition, the eighth strap column may be positioned between the seventh strap column and the second strap column 632 along the direction 300. The strap cell 604 may further include a ninth strap column formed of the strip-shaped PW region 679 (FIG. 6A). In addition, the ninth strap column may be positioned adjacent to the sixth strap column 640 along the direction 300.

Please refer to FIGS. 6A and 6B, the first strap row 642 (FIG. 6B) of the strap cell 604 includes the NW region 666, the NW region 668, a portion of the NW region 662-1, a portion of the NW region 662-2, a portion of the PW region 672-1, a portion of the PW region 672-2, the PW region 676, a portion of the horizontal portion 678-1 of the T-shaped PW region 678 and a portion of the strip-shaped PW region 679 (FIG. 6A), in accordance with some embodiments. For example, the NW regions (the NW region 666, the NW region 668, a portion of the NW region 662-1 and a portion of the NW region 662-2) and the PW regions (a portion of the PW region 672-1, a portion of the PW region 672-2, the PW region 676, a portion of the horizontal portion 678-1 of the T-shaped PW region 678 and a portion of the strip-shaped PW region 679) of the first strap row 642 are arranged alternately along the direction 300 (the row direction). The PW regions 672-1 and 672-2 may be positioned on opposite sides of the NW region 666 along the direction 300. In addition, the NW regions 662-1 and 662-2 may be positioned on opposite sides of the PW region 676 along the direction 300.

In some embodiments, the second strap row 644 (FIG. 6B) of the strap cell 604 is arranged adjacent to the first strap row 642. The second strap row 644 may include a strip-shaped PW region and a strip-shaped NW region connected to the strip-shaped PW region and a portion of the strip-shaped PW region 679 (FIG. 6A). For example, the strip-shaped PW region of the second strap row 644 may include the PW region 674, a portion of the PW region 672-1 and a portion of the PW region 672-2, a portion of the horizontal portion 678-1 and the vertical portion 678-2 of the T-shaped PW region 678. For example, strip-shaped NW region of the second strap row 644 may include the NW region 664, a portion of the NW region 662-1 and a portion of the NW region 662-2.

In some embodiments, the third strap row 646 (FIG. 6B) is arranged adjacent to the second strap row 644. The arrangements of the PW regions and the NW regions in the third strap row 646 may be the same or a similar to those in the first strap row 642. For example, the third strap row 646 (FIG. 6B) may include the NW region 667, the NW region 669, a portion of the NW region 662-1, a portion of the NW region 662-2, a portion of the PW region 672-1, a portion of the PW region 672-2, the PW region 677, a portion of the horizontal portion 678-1 of the T-shaped PW region 678 and a portion of the strip-shaped PW region 679 (FIG. 6A). For example, the NW regions (the NW region 667, the NW region 669, a portion of the NW region 662-1 and a portion of the NW region 662-2) and the PW regions (a portion of the PW region 672-1, a portion of the PW region 672-2, the PW region 676, a portion of the horizontal portion 678-1 of the T-shaped PW region 678 and a portion of the strip-shaped PW region 679) of the third strap row 646 are arranged alternately along the direction 300 (the row direction). The PW regions 672-1 and 672-2 may be positioned on opposite sides of the NW region 667 along the direction 300. In addition, the NW regions 662-1 and 662-2 may be positioned on opposite sides of the PW region 677 along the direction 300.

FIGS. 7A and 7B illustrate cross-sectional views along lines A1-A1' and A2-A2' of FIG. 6A. In addition, FIGS. 7A and 7B illustrate the relationship between the positions of the DNW region 680, the NW regions and the PW regions in the strap cell 604, the bit cell array 602A and the bit cell array 602B along the direction 302 (the column direction). The DNW region 680 may be connected to discrete NW regions (the H-shaped NW region 660, the NW region 666, 667, 668 and 669) in the strap cell 604 and overlaps the NW regions 252 in the bit cell array 602A and the bit cell array 602B (FIG. 6A). For example, the NW region 666 and the NW region 667 in the strap cell 604 may be connected to each other through the DNW region 680 as shown in FIG. 7A. In addition, the NW region 252 in the bit cell array 602A may be connected to the NW region 252 in the bit cell array 602B through the DNW region 680. Furthermore, the PW regions 254 may be positioned underlying the NW regions 252 and adjacent to opposite sides of the DNW region 680. For example, the NW region 664 and the PW regions 676 and 677 in the strap cell 604 are positioned overlying the DNW region 680 as shown in FIG. 7B. In addition, the PW regions 254 in the bit cell array 602A and the bit cell array 602B may be positioned overlying the DNW region 680 and adjacent to opposite sides of the DNW region 680.

Figure 8A:
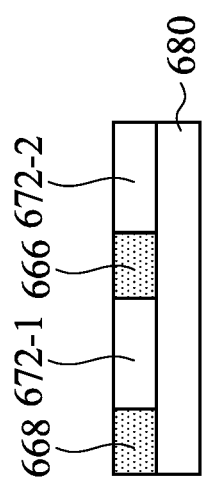
FIG. 8A illustrates a cross-sectional views taken along line B1-B1' of FIG. 6A.
Figure 8B:
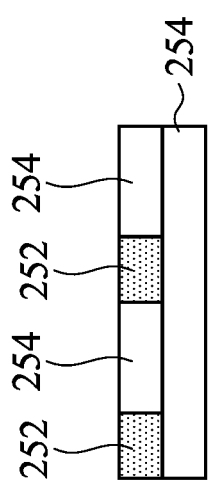
FIG. 8B illustrates a cross-sectional views taken along line B2-B2' of FIG. 6A.

FIGS. 8A and 8B illustrate cross-sectional views along lines B1-B1' and B2-B2' of FIG. 6A. In addition, FIGS. 8A and 8B illustrate the relationship between the positions of the DNW region 680, the NW regions and the PW regions in the strap cell 604, the bit cell array 602A and the bit cell array 602B along the direction 300 (the row direction). For example, the DNW region 680 may be positioned underlying the NW region 666, the NW region 667, the PW region 672-1 and the PW region 672-2 in the strap cell 604 as shown in FIG. 8A. The NW region 666 and the NW region 667 may be connected to each other through the DNW region 680. In addition, the NW region 666, the NW region 667, the PW region 672-1 and the PW region 672-2 may be arranged alternately along the direction 300 (the row direction). For example, the PW regions 254 may be connected to each other and extending under the NW regions 252 in the bit cell array 602A (or the bit cell array 602B) as shown in FIG. 8B. In addition, the NW regions 252 and the PW regions 254 may be arranged alternately along the direction 300 (the row direction).

Figure 9:
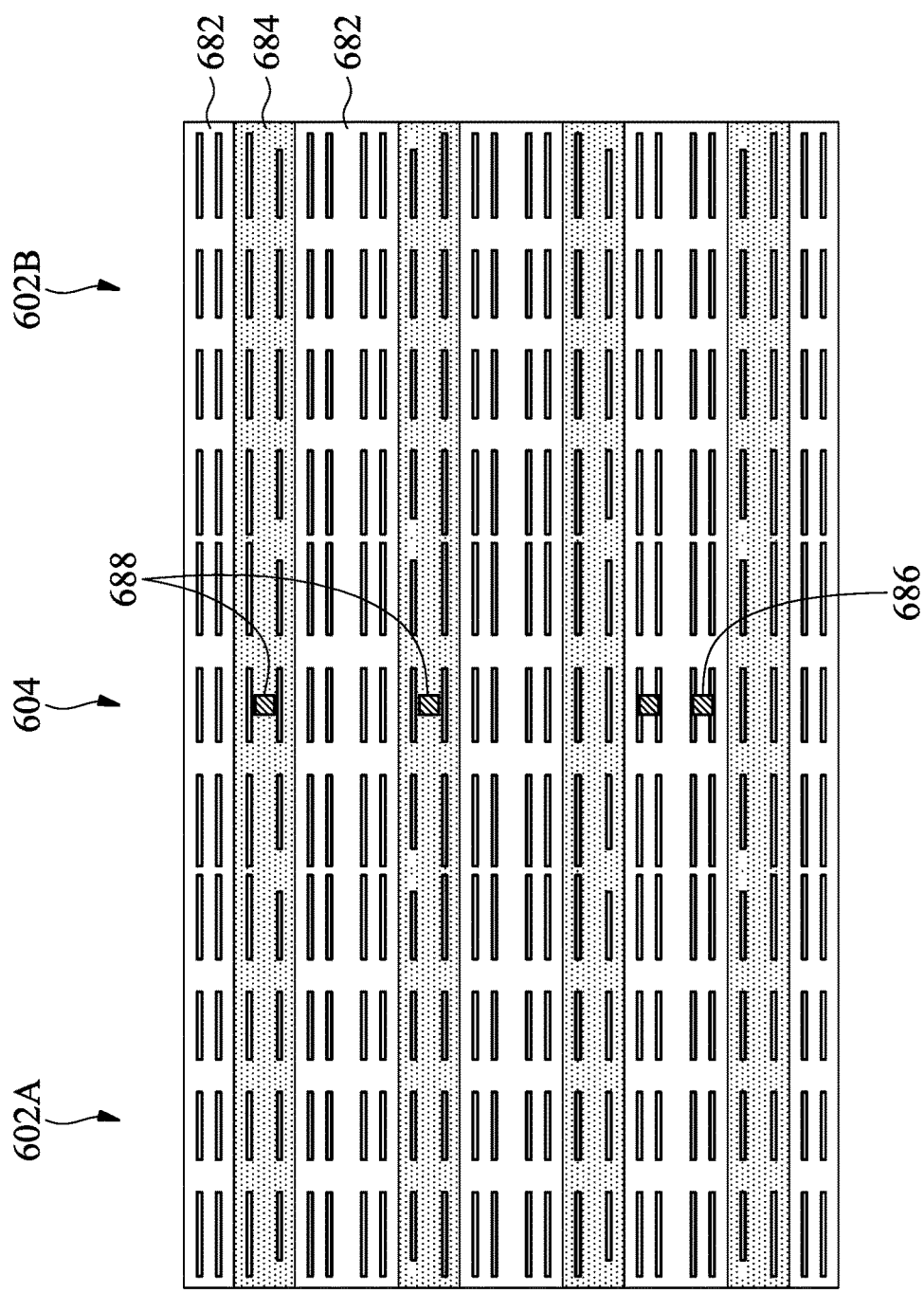
FIG. 9 illustrates a layout of an SRAM array in accordance with some embodiments.

FIG. 9 illustrates layouts of heavily doped N-type regions 682 and heavily doped P-type regions 684 in the SRAM array 600 shown in FIG. 6A (or FIG. 6B), in accordance with some embodiments. In addition, FIG. 9 illustrates the arrangements of the heavily doped N-type regions 682 and the heavily doped P-type regions 684 in the bit cell array 602A, the bit cell array 602B and the strap cell 604 of the SRAM array 600.

In some embodiments, the SRAM array 600 includes the heavily doped N-type regions 682 and the heavily doped P-type regions 684. Each of the heavily doped N-type regions 682 and the heavily doped P-type regions 684 may have a strip-shape extending along the direction 302 (e.g. the column direction). In addition, the heavily doped N-type regions 682 and the heavily doped P-type regions 684 may be arranged alternately along the direction 300 (e.g. the row direction).

In the strap cell 604, two of the heavily doped N-type regions 682 are positioned overlying the strip portions 672-1 and 672-2 of the H-shaped PW region 670 (FIG. 6A), in accordance with some embodiments shown in FIG. 9. Another of the heavily doped N-type regions 682 may be positioned overlying the linking portion 664 of the H-shaped NW region 660 and the PW regions 676 and 677 (FIG. 6A). In addition, other two of the heavily doped N-type regions 682 may be positioned overlying the horizontal portion 678-1 of the T-shaped PW region 678 and the strip-shaped PW region 679 (FIG. 6A). Furthermore, NW contacts 686 may be positioned on the heavily doped N-type region 682 overlying the linking portion 664 of the H-shaped NW region 660 (FIG. 6A).

Because the H-shaped NW region 660 and the NW regions 666, 667, 668 and 669 are electrically connected to each other by the DNW region 680 (FIG. 7A), the NW contacts 686 may serve as contacts of the H-shaped NW region 660 and the NW regions 666, 667, 668 and 669.

In the strap cell 604, two of the heavily doped P-type regions 684 are positioned overlying the strip portions 662-1 and 662-2 of the H-shaped NW region 660 (FIG. 6A), in accordance with some embodiments shown in FIG. 9. Another of the heavily doped P-type regions 684 may be positioned overlying the linking portion 674 of the H-shaped PW region 670 and the NW regions 666 and 667 (FIG. 6A). In addition, yet another of the heavily doped P-type regions 684 may be positioned overlying the vertical portion 678-2 of the T-shaped PW region 678 (FIG. 6A). Furthermore, PW contacts 688 may be positioned on the heavily doped P-type regions 684 overlying the strip portions 672-1 and 672-2 of the H-shaped PW region 670 (FIG. 6A).

Because the H-shaped PW region 670, the PW region, 676 and 677, the T-shaped PW region 678 and the strip-shaped PW region 679 are electrically connected to each other (FIG. 7B), the PW contacts 688 may serve as contacts of the H-shaped PW region 670, the PW region, 676 and 677, the T-shaped PW region 678 and the strip-shaped PW region 679.

In some embodiments, the heavily doped N-type regions 682 are positioned overlying the PW regions 254 in the bit cell array 602A and the bit cell array 602B. The heavily doped P-type regions 684 may be positioned overlying the NW regions 252 in the bit cell array 602A and the bit cell array 602B.

In some embodiments, the strap cell 604 of the SRAM array 600 includes discrete NW regions and PW regions arranged alternately along the direction 300 (the row direction) and along the direction 302 (the column direction). The NW regions (or the PW regions) positioned in the strap cell 604 and close to the boundary 681 of the DNW region 680 may directly connect to the corresponding NW regions 252 (or the corresponding PW regions 254) in the bit cell array 602A and the bit cell array 602B. For example, the discrete NW regions in the strap cell 604 may include the H-shaped NW region 660 and NW regions 666, 667, 668 and 669. The discrete PW regions in the strap cell 604 may include the H-shaped PW region 670, the T-shaped PW region 678, the strip-shaped PW region 679 and the discrete PW regions 676 and 677. In addition, the discrete NW regions 666, 667, 668 and 669 may be connected to each other through the DNW region 680 underlying the NW regions. Therefore, the number of NW pick-up regions (the NW contacts 686) may be reduced. Furthermore, the strap cell and the bit cell array may have the same arrangements of the heavily doped N-type regions and the heavily doped P-type regions. For example, the heavily doped N-type (N+) regions 682 and the heavily doped P-type (P+) regions 684 in the strap cell 604 and the bit cell arrays 602A and 602B may be arranged extending along the direction 302 (the column direction) and alternately along the direction 300 (the row direction). The length of the strap cell 604 along the direction 302 may be further reduced. For example, the length of the strap cell 604 may be reduced equal to or less than six times as large as the poly height (also referred to as poly (gate) pitch (i.e. the length of poly (gate) to poly (gate) within a regular pattern). Therefore, the distance between the well pick-up region (e.g., the PW contact or the NW contact) and the corresponding well regions (e.g., the NW regions 252 or the PW regions 254) in the SRAM cell 500 in the bit cell array (602A or 602B) may be reduced. The resistance of the well regions may be reduced. The latch-up problem may be avoided.

As described previously, embodiments of a static random access memory (SRAM) array 600 are provided. In some embodiments, the strap cell 604 of the SRAM array 600 includes the H-shaped NW region 660, the H-shaped PW region 670 and the deep N-type well (DNW) region 680. The H-shaped NW region 660 and the H-shaped PW region 670 each includes two strip portions (e.g., the strip portions 662-1, 662-2, 672-1 and 672-2) extending along the first direction (e.g., the direction 302) and the linking portion (e.g., the linking portions 664 and 674) extending along the second direction (e.g., the direction 300). Two terminals (e.g., the terminals 664-1, 664-2, 674-1 and 674-2) of the linking portion are in contact with the two strip portions. In some embodiments, the strap cell 604 of the SRAM array 600 includes a first strap column 630, a first strap row 642 and a deep N-type well (DNW) region 680. The first strap column 630 includes a first P-type well (PW) region (e.g., the linking portion 674 of the H-shaped PW region 670) and a first N-type well (NW) region (e.g., the NW region 666) and a second NW region (e.g., the NW region 667) on opposite sides of the first PW region along the first direction (e.g., the direction 302). The first strap row 642 includes the first NW region (e.g., the NW region 666) and a second PW region (e.g., a portion of the PW region 672-1) and a third PW region (e.g., a portion of the PW region 672-2) on opposite sides of the first NW region. The deep N-type well (DNW) region 680 is positioned underlying and connected to the first NW region and the second NW region of the first strap column. The arrangements of the NW regions and the PW regions of the strap cell 604 may reduce the area of the strap cell. The resistance of the well regions may be reduced. The latch-up problem may be avoided.

Embodiments of a static random access memory (SRAM) array are provided. The SRAM array is positioned between a first bit cell array and a second bit cell array along a first direction and is arranged along a second direction. The strap cell includes an H-shaped NW region, an H-shaped PW region and a deep N-type well (DNW) region. The H-shaped NW region and the H-shaped PW region each includes two strip portions extending along the first direction and a linking portion extending along the second direction. The distance between the well pick-up region and the corresponding well regions in the SRAM cell in the bit cell array may be reduced. The resistance of the well regions may be reduced. The latch-up problem may be avoided.

In some embodiments, a static random access memory (SRAM) array includes a first bit cell array, a second bit cell array and a strap cell. The second bit cell array is arranged along a first direction. The strap cell is arranged along a second direction and is positioned between the first bit cell array and the second bit cell array along the first direction. The strap cell includes an H-shaped NW region, an H-shaped PW region and a deep N-type well (DNW) region. The H-shaped NW region and the H-shaped PW region each includes two strip portions extending along the first direction and a linking portion extending along the second direction. Two terminals of the linking portion are in contact with the two strip portions.

In some embodiments, a static random access memory (SRAM) array includes a first bit cell array, a second bit cell array and a strap cell. The second bit cell array is arranged along a first direction. The strap cell is arranged along a second direction and is positioned between the first bit cell array and the second bit cell array along the first direction. The strap cell includes a first strap column, a first strap row and a deep N-type well (DNW) region. The first strap column includes a first P-type well (PW) region and a first N-type well (NW) region and a second NW region on opposite sides of the first PW region along the first direction. The first strap row includes the first NW region and a second PW region and a third PW region on opposite sides of the first NW region. The deep N-type well (DNW) region is positioned underlying and connected to the first NW region and the second NW region of the first strap column.

In some embodiments, a static random access memory (SRAM) array includes a first bit cell array, a second bit cell array and a strap cell. The first bit cell array and the second bit cell array are arranged along a first direction. The first bit cell array and the second bit cell array each includes a plurality of functional SRAM cells. The strap cell is arranged in a second direction and is positioned between the first bit cell array and the second bit cell array along the first direction. The strap cell includes a first strap column, a second strap column, a heavily doped P-type region, a heavily doped N-type region and a deep N-type well (DNW) region. The first strap column includes a first P-type well (PW) region and two first N-type well (NW) regions adjacent opposite sides of the first PW region along the first direction. The second strap column is positioned adjacent to the first strap column along the second direction. The second strap column includes a second NW region and two second PW regions adjacent opposite sides of the second NW region along the first direction. The heavily doped P-type region is positioned overlying the first PW region and the two first NW regions of the first strap column. The heavily doped N-type region is positioned overlying the second NW region and the two second PW regions of the second strap column. The deep N-type well (DNW) region is positioned underlying the two first NW regions and the second NW region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM) array, comprising:

a first bit cell array and a second bit cell array arranged along a first direction;
a strap cell arranged along a second direction and positioned between the first bit cell array and the second bit cell array along the first direction,
wherein the strap cell comprises:
an H-shaped NW region;
an H-shaped PW region adjacent to the H-shaped NW region along the second direction, wherein the H-shaped NW region and the H-shaped PW region each comprises:
two strip portions extending along the first direction; and
a linking portion extending along the second direction, wherein two terminals of the linking portion are in contact with the two strip portions; and
a deep N-type well (DNW) region underlying the H-shaped NW region and the H-shaped PW region.

2. The SRAM array as claimed in claim 1, wherein the strap cell comprises:
a first PW region and a second PW region adjacent to opposite sides of the linking portion of the H-shaped NW region along the first direction; and
a first NW region and a second NW region adjacent to opposite sides of the linking portion of the H-shaped PW region along the first direction.

3. The SRAM array as claimed in claim 2, wherein the first bit cell array and the second bit cell array each comprises:
third NW regions extending along the first direction; and
third PW regions extending along the first direction, wherein the third NW regions and the third PW regions are arranged alternately along the second direction.

4. The SRAM array as claimed in claim 3, wherein the first PW region and the second PW region of the strap cell are respectively in direct contact with the corresponding third PW region of the first bit cell array and the corresponding third PW region of the second bit cell array.

5. The SRAM array as claimed in claim 3, wherein the first NW region and the second NW region of the strap cell are respectively in direct contact with the corresponding third NW region of the first bit cell array and the corresponding third NW region of the second bit cell array.

6. The SRAM array as claimed in claim 1, wherein the first bit cell array and the second bit cell array each comprises a plurality of SRAM cells, wherein some of the SRAM cells in a column share a bit line (BL).

7. The SRAM array as claimed in claim 6, wherein each of the SRAM cells in the first bit cell array and the second bit cell array has a pitch along the second direction, wherein the total width of the H-shaped NW region and the H-shaped PW region along the second direction is three times as long as the pitch.

8. A static random access memory (SRAM) array, comprising:
a first bit cell array and a second bit cell array arranged along a first direction;
a strap cell arranged along a second direction and positioned between the first bit cell array and the second bit cell array along the first direction,
wherein the strap cell comprises:
an H-shaped NW region;
an H-shaped PW region adjacent to the H-shaped NW region along the second direction, wherein the H-shaped NW region and the H-shaped PW region each comprises:
two strip portions extending along the first direction; and
a linking portion extending along the second direction, wherein two terminals of the linking portion are in contact with the two strip portions;
a first PW region and a second PW region adjacent to opposite sides of the linking portion of the H-shaped NW region along the first direction;
a first NW region and a second NW region adjacent to opposite sides of the linking portion of the H-shaped PW region along the first direction;
a deep N-type well (DNW) region underlying the H-shaped NW region and the H-shaped PW region;
a first heavily doped P-type region overlying the two strip portions of the H-shaped NW region; and
a first heavily doped N-type region overlying the linking portion of the H-shaped NW region, the first PW region, and the second PW region.

9. The SRAM array as claimed in claim 8, wherein the first bit cell array and the second bit cell array each comprises:
third NW regions extending along the first direction; and
third PW regions extending along the first direction, wherein the third NW regions and the third PW regions are arranged alternately along the second direction.

10. The SRAM array as claimed in claim 9, wherein the first PW region and the second PW region of the strap cell are respectively in direct contact with the corresponding third PW region of the first bit cell array and the corresponding third PW region of the second bit cell array.

11. The SRAM array as claimed in claim 9, wherein the first NW region and the second NW region of the strap cell are respectively in direct contact with the corresponding third NW region of the first bit cell array and the corresponding third NW region of the second bit cell array.

12. The SRAM array as claimed in claim 8, wherein the first bit cell array and the second bit cell array each comprises a plurality of SRAM cells, wherein some of the SRAM cells in a column share a bit line (BL).

13. The SRAM array as claimed in claim 12, wherein each of the SRAM cells in the first bit cell array and the second bit cell array has a pitch along the second direction, wherein the total width of the H-shaped NW region and the H-shaped PW region along the second direction is three times as long as the pitch.

14. A static random access memory (SRAM) array, comprising:
a first bit cell array and a second bit cell array arranged along a first direction;
a strap cell arranged along a second direction and positioned between the first bit cell array and the second bit cell array along the first direction,
wherein the strap cell comprises:
an H-shaped NW region;
an H-shaped PW region adjacent to the H-shaped NW region along the second direction, wherein the H-shaped NW region and the H-shaped PW region each comprises:
two strip portions extending along the first direction; and
a linking portion extending along the second direction, wherein two terminals of the linking portion are in contact with the two strip portions;
a first PW region and a second PW region adjacent to opposite sides of the linking portion of the H-shaped NW region along the first direction;

a first NW region and a second NW region adjacent to opposite sides of the linking portion of the H-shaped PW region along the first direction;

a deep N-type well (DNW) region underlying the H-shaped NW region and the H-shaped PW region;

a second heavily doped N-type region overlying the two strip portions of the H-shaped PW region; and a second heavily doped P-type region overlying the linking portion of the H-shaped PW region, the first NW region, and the second NW region.

15. The SRAM array as claimed in claim 14, wherein the widths of the strip portions of the H-shaped PW region are greater than the width of the linking portion of the H-shaped PW region along the second direction.

16. The SRAM array as claimed in claim 14, wherein the width of the linking portion of the H-shaped NW region is greater than the widths of the strip portions of the H-shaped NW region along the second direction.

17. The SRAM array as claimed in claim 14, wherein the first bit cell array and the second bit cell array each comprises:

third NW regions extending along the first direction; and third PW regions extending along the first direction, wherein the third NW regions and the third PW regions are arranged alternately along the second direction.

18. The SRAM array as claimed in claim 17, wherein the first PW region and the second PW region of the strap cell are respectively in direct contact with the corresponding third PW region of the first bit cell array and the corresponding third PW region of the second bit cell array.

19. The SRAM array as claimed in claim 17, wherein the first NW region and the second NW region of the strap cell are respectively in direct contact with the corresponding third NW region of the first bit cell array and the corresponding third NW region of the second bit cell array.

20. The SRAM array as claimed in claim 14, wherein the first bit cell array and the second bit cell array each comprises a plurality of SRAM cells, wherein some of the SRAM cells in a column share a bit line (BL).

* * * * *